US012698369B2

(12) United States Patent
Sobue et al.

(10) Patent No.: US 12,698,369 B2
(45) Date of Patent: Aug. 4, 2026

(54) RESIN COMPOSITION FOR TEMPORARY FIXATION, SUBSTRATE-CONVEYING SUPPORT TAPE, AND ELECTRONIC EQUIPMENT DEVICE MANUFACTURING METHOD

(71) Applicant: Resonac Corporation, Tokyo (JP)

(72) Inventors: Shogo Sobue, Tokyo (JP); Shinji Irizawa, Tokyo (JP); Mika Tanaka, Tokyo (JP); Saeko Ogawa, Tokyo (JP)

( * ) Notice: Subject to any disclaimer, the term of this patent is extended or adjusted under 35 U.S.C. 154(b) by 278 days.

(21) Appl. No.: 17/770,627

(22) PCT Filed: Oct. 31, 2019

(86) PCT No.: PCT/JP2019/042917
§ 371 (c)(1),
(2) Date: Apr. 21, 2022

(87) PCT Pub. No.: WO2021/084716
PCT Pub. Date: May 6, 2021

(65) Prior Publication Data
US 2022/0289920 A1 Sep. 15, 2022

(51) Int. Cl.
*C08J 5/18* (2006.01)
*B32B 7/10* (2006.01)
(Continued)

(52) U.S. Cl.
CPC ................ *C08J 5/18* (2013.01); *H10P 72/70* (2026.01); *B32B 7/10* (2013.01); *B32B 27/18* (2013.01);
(Continued)

(58) Field of Classification Search
None
See application file for complete search history.

(56) References Cited

U.S. PATENT DOCUMENTS 12,509,615 B2 * 12/2025 Irizawa .................... C09J 7/385
2009/0176349 A1 * 7/2009 Jakob .................. H01L 21/6836 156/345.1
(Continued)

FOREIGN PATENT DOCUMENTS

JP 4565804 10/2010
JP 4936667 5/2012
(Continued)

OTHER PUBLICATIONS

JP 2015-218320 A (Tokuyasu et al) (published Dec. 7, 2015) (machine translation) (Year: 2015).*
(Continued)

*Primary Examiner* — Vivian Chen
(74) *Attorney, Agent, or Firm* — SHIPWAY IP

(57) ABSTRACT

A method for producing an electronic device includes a first step of pasting a support to an organic substrate having a thickness of 1000 μm or less, with a temporary fixing material interposed therebetween, to obtain a laminated body; a second step of heating the temporary fixing material of the laminated body; a third step of mounting a semiconductor chip on the organic substrate of the laminated body that has been subjected to the second step; a fourth step of sealing the semiconductor chip mounted on the organic substrate with a sealing material; and a fifth step of peeling the support and the temporary fixing material from the organic substrate of the laminated body that has been subjected to the fourth step.

13 Claims, 5 Drawing Sheets

(51) Int. Cl.

| | |
|---|---|
| ***B32B 27/18*** | (2006.01) |
| ***B32B 27/20*** | (2006.01) |
| ***B32B 27/26*** | (2006.01) |
| ***B32B 27/28*** | (2006.01) |
| ***B32B 27/30*** | (2006.01) |
| ***B32B 27/32*** | (2006.01) |
| ***B32B 27/34*** | (2006.01) |
| ***B32B 27/36*** | (2006.01) |
| ***B32B 37/12*** | (2006.01) |
| ***C09J 7/22*** | (2018.01) |
| ***C09J 7/38*** | (2018.01) |
| ***C09J 11/08*** | (2006.01) |
| ***C09J 133/06*** | (2006.01) |
| ***C09J 163/00*** | (2006.01) |
| ***H10P 72/70*** | (2026.01) |
| ***H10W 72/00*** | (2026.01) |
| ***H10W 74/01*** | (2026.01) |
| ***H10W 74/47*** | (2026.01) |
| ***H10W 90/00*** | (2026.01) |

(52) U.S. Cl.

CPC ............... *B32B 27/20* (2013.01); *B32B 27/26* (2013.01); *B32B 27/28* (2013.01); *B32B 27/281* (2013.01); *B32B 27/30* (2013.01); *B32B 27/308* (2013.01); *B32B 27/32* (2013.01); *B32B 27/34* (2013.01); *B32B 27/36* (2013.01); *B32B 37/12* (2013.01); *B32B 2333/04* (2013.01); *B32B 2367/00* (2013.01); *B32B 2377/00* (2013.01); *B32B 2379/00* (2013.01); *B32B 2405/00* (2013.01); *B32B 2457/08* (2013.01); *B32B 2457/14* (2013.01); *C08J 2323/12* (2013.01); *C08J 2367/03* (2013.01); *C08J 2377/02* (2013.01); *C08J 2379/08* (2013.01); *C08J 2433/06* (2013.01); *C08J 2463/04* (2013.01); *C09J 7/22* (2018.01); *C09J 7/38* (2018.01); *C09J 7/385* (2018.01); *C09J 11/08* (2013.01); *C09J 133/06* (2013.01); *C09J 163/00* (2013.01); *C09J 2203/326* (2013.01); *C09J 2203/37* (2020.08); *C09J 2301/312* (2020.08); *C09J 2301/408* (2020.08); *C09J 2423/106* (2013.01); *C09J 2467/006* (2013.01); *C09J 2477/006* (2013.01); *C09J 2479/086* (2013.01); *H10P 72/74* (2026.01); *H10P 72/7402* (2026.01); *H10W 72/07207* (2026.01); *H10W 74/019* (2026.01); *H10W 74/473* (2026.01); *H10W 90/724* (2026.01)

(56) References Cited

U.S. PATENT DOCUMENTS

| | | | | |
|---|---|---|---|---|
| 2010/0038035 | A1* | 2/2010 | Noda | H01L 21/6836 156/379.6 |
| 2010/0041211 | A1* | 2/2010 | Noda | H01L 21/6835 438/464 |
| 2018/0281361 | A1* | 10/2018 | Oda | C09J 7/30 |
| 2019/0283373 | A1* | 9/2019 | Kasahara | H05K 1/03 |
| 2021/0020460 | A1* | 1/2021 | Kuroda | H01L 24/96 |
| 2021/0050274 | A1* | 2/2021 | Tomori | C09J 7/29 |
| 2022/0010116 | A1* | 1/2022 | Uchida | C09J 5/00 |
| 2022/0020606 | A1* | 1/2022 | Kuroda | H01L 24/45 |
| 2022/0285200 | A1* | 9/2022 | Kuroda | H01L 24/97 |
| 2022/0319873 | A1* | 10/2022 | Nagoya | H01L 24/48 |
| 2023/0039482 | A1* | 2/2023 | Irizawa | B32B 37/025 |

FOREIGN PATENT DOCUMENTS

| | | | |
|---|---|---|---|
| JP | 2012-214526 | A * | 11/2012 |
| JP | 2013-181049 | A * | 9/2013 |
| JP | 2016-216572 | | 12/2016 |
| JP | 2018-014388 | | 1/2018 |
| JP | 2019-114599 | | 7/2019 |
| JP | 2019-151696 | | 9/2019 |
| WO | WO 2020-136904 | A1 * | 7/2020 |

OTHER PUBLICATIONS

International Search Report dated Feb. 4, 2020 for PCT/JP2019/042917.

International Preliminary Report on Patentability with Written Opinion dated May 12, 2022 for PCT/JP2019/042917.

* cited by examiner

RESIN COMPOSITION FOR TEMPORARY FIXATION, SUBSTRATE-CONVEYING SUPPORT TAPE, AND ELECTRONIC EQUIPMENT DEVICE MANUFACTURING METHOD

CROSS-REFERENCE TO RELATED APPLICATIONS

This application is a 35 U.S.C. § 371 national phase application of PCT/JP2019/042917, filed on Oct. 31, 2019.

TECHNICAL FIELD

The present invention relates to a resin composition for temporary fixing, a support tape for substrate conveyance, and a method for producing an electronic device.

BACKGROUND ART

Along with multi-functionalization of electronic equipment such as smartphones and tablet PCs, stacked MCPs (Multi Chip Packages) having increased capacity by stacking semiconductor elements in multiple stages have been in widespread use. For the packaging of semiconductor elements, film-shaped adhesives are widely used as die-bonding adhesives. However, in the currently used methods for connecting a semiconductor element using wire bonding, the operation of electronic equipment tends to be slow because the data processing speed is limited. Furthermore, since there is a growing need to suppress power consumption to a low level and to use electronic equipment for a longer time without charging, electric power saving is also required. From such a point of view, in recent years, electronic devices having a new structure in which semiconductor elements are connected to each other by means of through-electrodes instead of wire bonding have also been developed for the purpose of further speed improvement and electric power saving.

Although electronic devices having a new structure have been developed as such, there is still a demand for higher capacity, and development of a technology capable of stacking semiconductor elements in a greater number of stages regardless of the package structure is underway. However, in order to stack more semiconductor elements in a limited space, stabilized thickness reduction of semiconductor elements is indispensable.

For example, thickness reduction has been achieved by grinding a semiconductor wafer from the back surface side. In a grinding process at this time, it is mainstream to perform the grinding process in a state in which a tape known as so-called BG tape (back grinding tape) is stuck to a semiconductor to support the semiconductor wafer. However, the semiconductor wafer to be supplied to the grinding process has a circuit formed on the front surface side, and due to the influence of the circuit, warpage is likely to occur when thickness is reduced by grinding. Since a BG tape is made of a tape material that is easily deformable, the BG tape cannot sufficiently support a semiconductor wafer that has been reduced in thickness, and warpage is likely to occur in the semiconductor wafer. Thus, a method of fixing a wafer to a support by means of a tacky adhesive and subjecting the wafer to back surface grinding and conveyance has been proposed (see, for example, the following Patent Literatures 1 and 2).

CITATION LIST

Patent Literature

Patent Literature 1: Japanese Patent No. 4565804
Patent Literature 2: Japanese Patent No. 4936667

SUMMARY OF INVENTION

Technical Problem

However, in order to attempt thickness reduction of semiconductor elements, it has been investigated to use a thin organic substrate as the substrate, and specifically, development of a coreless substrate that does not use a core layer obtained by impregnating a glass cloth with a thermosetting resin has been in active progress. Since a coreless substrate does not have a core layer, it is possible to make the layer thickness of the substrate thin; however, on the other hand, since a highly elastic core layer is not present, it is difficult to secure rigidity of the substrate itself, and handleability in the production process for semiconductor elements becomes a problem to be solved.

Thus, it is an object of the present invention to provide a method for producing an electronic device, by which an electronic device including a semiconductor element with a reduced thickness can be produced with high productivity by using an organic substrate, and a resin composition for temporary fixing and a support tape for substrate conveyance, both of which can be used for the method.

Solution to Problem

In order to solve the above-described problems, the inventors of the present invention conducted investigation on the production of a semiconductor element that uses a coreless substrate and on the production of an electronic device that uses the semiconductor element. With regard to the problem of handleability, there is a problem of deflection in the organic substrate during conveyance; however, pasting a support to the organic substrate has been investigated as means for solving this problem. In such a process, it is necessary to use a temporary fixing material such as a tacky adhesive for the fixing of the support, in order to peel the stuck support from the organic substrate. It is known to blend in a release agent as means for adjusting the peelability of the temporary fixing material. However, with regard to a substrate having a semiconductor packaged thereon, it is required that contamination due to residue or the like after peeling the temporary fixing material is as small as possible, and when the release agent is easily transferable from the temporary fixing material to the substrate, and particularly a silicone-based release agent remains on the organic substrate, it is not desirable from the viewpoint of connection reliability.

Incidentally, since related art technologies including the above-mentioned patent literatures and the like assume processing of semiconductor wafers, although the peelability against silicon wafers has been examined, there is no information on the problems of the peelability against the organic substrate and the above-described release agent.

Thus, the inventors of the present invention conducted an investigation on a resin composition for temporary fixing for temporarily fixing a support for substrate conveyance to an organic substrate, and as a result, the inventors found that with regard to a resin composition which contains a thermoplastic resin and either includes no silicone-based release agent or has the content of a silicone-based release agent limited to a specific level or less, when the shear viscosity at the time of forming the resin composition into a film shape, the elastic modulus after subjecting the resin composition to predetermined heating, and the 5% weight reduction temperature after subjecting the resin composition to predetermined heating, are adjusted to specific ranges, the resin composition can exhibit appropriate peel strength with respect to an organic substrate. Thus, the inventors completed the present invention based on these findings.

An aspect of the present invention relates to a method for producing an electronic device, the method including a first step of pasting a support to an organic substrate having a thickness of 1000 μm or less, with a temporary fixing material interposed therebetween, to obtain a laminated body; a second step of heating the temporary fixing material of the laminated body; a third step of mounting a semiconductor chip on the organic substrate of the laminated body that has been subjected to the second step; a fourth step of sealing the semiconductor chip mounted on the organic substrate with a sealing material; and a fifth step of peeling the support and the temporary fixing material from the organic substrate of the laminated body that has been subjected to the fourth step, wherein the temporary fixing material contains a thermoplastic resin and either contains no silicone-based release agent or has a content of a silicone-based release agent of 10% by mass or less based on the total amount of the temporary fixing material, and the temporary fixing material has a shear viscosity of 100 to 1000 Pa·s at 60° C., an elastic modulus of 10 to 1000 MPa at 25° C. after being heated for 30 minutes at 130° C. and for 1 hour at 170° C., and a 5% weight reduction temperature of 300° C. or higher after being heated for 30 minutes at 130° C. and for 1 hour at 170° C.

According to the method for producing an electronic device according to the present invention, an electronic device including a semiconductor element with a reduced thickness can be produced with high productivity by using an organic substrate. That is, in the present production method, since the temporary fixing material has a specific composition and exhibits a specific shear viscosity, a specific elastic modulus, and a specific 5% weight reduction temperature, the above-mentioned effects can be provided due to the following factors: (i) an organic substrate and a support can be stuck together in the first step, and the handleability of the thin organic substrate is enhanced (for example, conveyance of the thin organic substrate is facilitated); (ii) the temporary fixing material that has been subjected to the second step can sufficiently fix the organic substrate and the support in the third step and the fourth step, and packaging and sealing of a semiconductor chip can be efficiently achieved; and (iii) the temporary fixing material can be easily peeled from the organic substrate without contaminating the substrate surface in the fifth step.

The organic substrate may be a coreless substrate.

The support may be a polyethylene terephthalate film, a polybutylene terephthalate film, a polyethylene naphthalate film, a polypropylene film, a polyamide film, or a polyimide film.

In the first step, the support is in a tape form and may be continuously supplied. In this case, a thin organic substrate can be continuously conveyed, and enhancement of productivity and the like can be attempted.

In the first step, the above-described laminated body can be obtained by using a support tape, which includes: a support film as the support; and a temporary fixing material layer provided on the support film and formed from the above-described temporary fixing material.

A method of using such a support tape can make the variation of the temporary fixing material smaller as compared to the case where a liquid temporary fixing material is applied to form a temporary fixing material layer on an organic substrate or a support, and the semiconductor elements obtainable after processing are easily made uniform. Furthermore, it is easy to utilize the temporary fixing material without wasting.

Another aspect of the present invention relates to a resin composition for temporary fixing for temporarily fixing a support for substrate conveyance to an organic substrate, the resin composition for temporary fixing containing a thermoplastic resin and either containing no silicone-based release agent or having a content of a silicone-based release agent of 10% by mass or less based on the total amount of the resin composition, wherein when the resin composition for temporary fixing is formed into a film shape, the film has a shear viscosity of 100 to 1000 Pa·s at 60° C., has an elastic modulus of 10 to 1000 MPa at 25° C. after being heated for 30 minutes at 130° C. and for 1 hour at 170° C., and has a 5% weight reduction temperature of 300° C. or higher after being heated for 30 minutes at 130° C. and for 1 hour at 170° C.

According to the resin composition for temporary fixing according to the present invention, an organic substrate and a support for conveyance can be sufficiently fixed, and at the same time, the support can be easily peeled from the organic substrate without contaminating the substrate surface.

Another aspect of the present invention relates to a support tape for substrate conveyance, the support tape including: a support film for conveying an organic substrate; and a temporary fixing material layer provided on the support film for temporarily fixing an organic substrate and the support film, wherein the temporary fixing material layer contains a thermoplastic resin and either contains no silicone-based release agent or has a content of a silicone-based release agent of 10% by mass or less based on the total amount of the temporary fixing material, and the support tape for substrate conveyance has a shear viscosity of 100 to 10000 Pa·s at 60° C., an elastic modulus of 10 to 1000 MPa at 25° C. after being heated for 30 minutes at 130° C. and for 1 hour at 170° C., and a 5% weight reduction temperature of 300° C. or higher after being heated for 30 minutes at 130° C. and for 1 hour at 170° C.

The support tape for substrate conveyance according to the present invention can enhance the handleability of the organic substrate and can be easily peeled from the organic substrate without contaminating the substrate surface.

The support film may be a polyethylene terephthalate film, a polybutylene terephthalate film, a polyethylene naphthalate film, a polypropylene film, a polyamide film, or a polyimide film.

Advantageous Effects of Invention

According to the present invention, a method for producing an electronic device, by which an electronic device including a semiconductor element with a reduced thickness can be produced with high productivity by using an organic substrate, and a resin composition for temporary fixing and a support tape for substrate conveyance, both of which can be used for the method, can be provided.

The resin composition for temporary fixing according to the present invention can sufficiently fix an organic substrate and a support for conveyance, and at the same time, the support can be easily peeled from the organic substrate without contaminating the substrate surface. The support tape for substrate conveyance according to the present invention can enhance the handleability of the organic substrate and can be easily peeled from the organic substrate without contaminating the substrate surface.

BRIEF DESCRIPTION OF DRAWINGS

FIG. 1(A) is a top view, while FIG. 1(B) is a schematic cross-sectional view taken along the line I-I in FIG. 1(A).

FIG. 2(A) is a top view, while FIG. 2(B) is a schematic cross-sectional view taken along the line II-II in FIG. 2(A).

DESCRIPTION OF EMBODIMENTS

Figure 1:
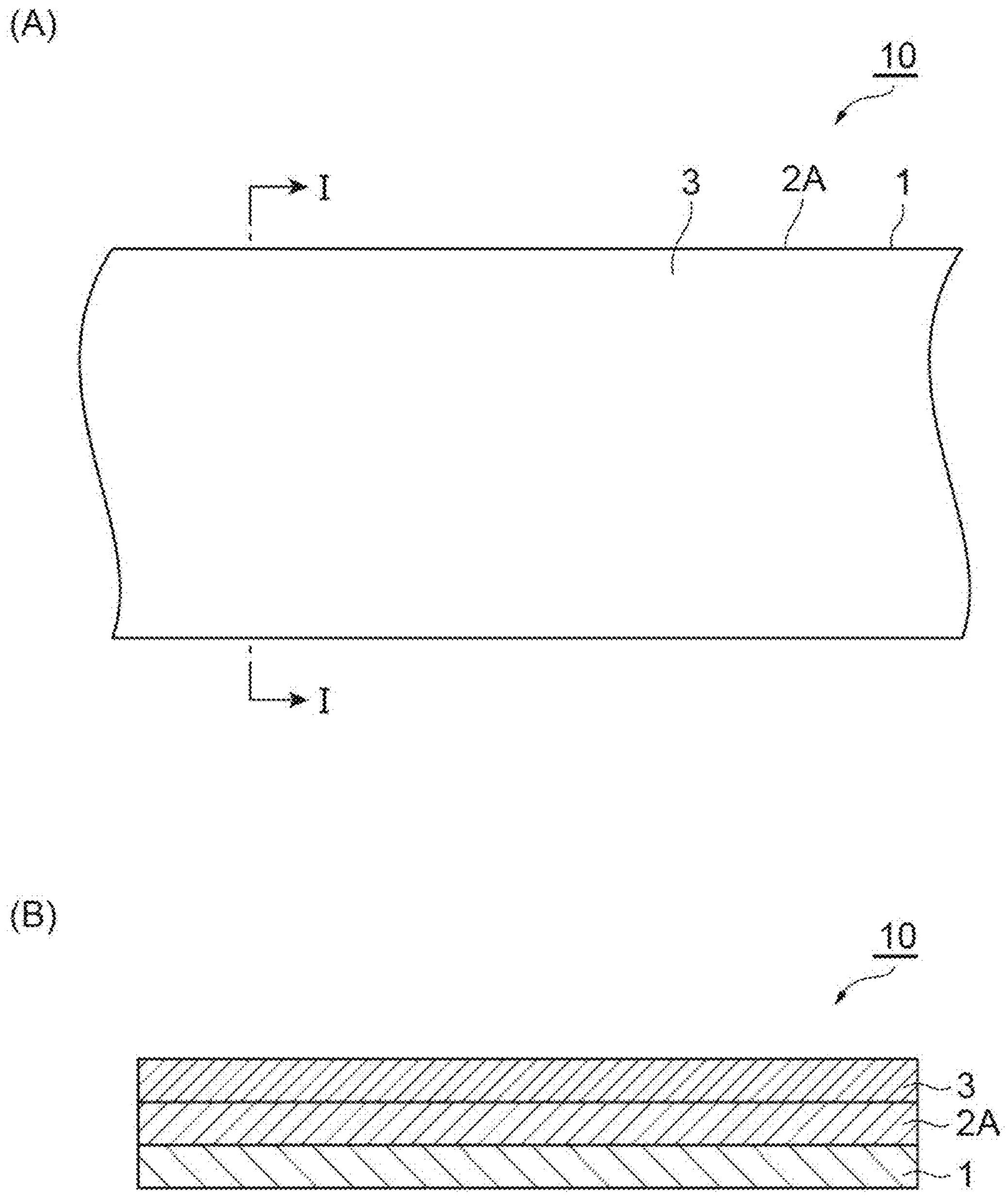
FIG. 1 is diagrams illustrating an embodiment of a support tape for substrate conveyance.

Hereinafter, embodiments for carrying out the present invention will be described in detail with reference to the drawings as necessary. However, the present invention is not limited to the following embodiments. According to the present specification, "(meth)acrylic acid" means acrylic acid or methacrylic acid, and "(meth)acrylate" means an acrylate or a methacrylate corresponding thereto. Regarding the expression "A or B", any one of A and B may be included, and it is also acceptable that both are included.

Furthermore, the term "layer" according to the present specification includes a structure having a shape that is formed over the entire surface when observed as a plan view, as well as a structure having a shape that is formed in a portion. Furthermore, the term "process" according to the present specification does not refer only to an independent process, and even in a case where a process is not clearly distinguishable from other processes, the process is included in the present term as long as the predetermined action of that process is achieved. Furthermore, a numerical value range indicated using the term "to" indicates a range including the numerical values described before and after the term "to" as the minimum value and the maximum value, respectively.

Furthermore, regarding the content of each component in a composition according to the present specification, when a plurality of substances corresponding to each component is present in the composition, unless particularly stated otherwise, the content means the total amount of the substances present in the composition. Furthermore, unless particularly stated otherwise, the exemplified materials may be used singly, or two or more kinds thereof may be used in combination.

Furthermore, with regard to numerical value ranges described stepwise in the present specification, the upper limit value or lower limit value of a numerical value range of a certain stage may be replaced with the upper limit value or lower limit value of a numerical value range of another stage. Furthermore, with regard to a numerical value range described in the present specification, the upper limit value or lower limit value of the numerical value range may be replaced with a value shown in Examples.

[Resin Composition for Temporary Fixing]

The resin composition for temporary fixing according to the present embodiment includes a thermoplastic resin. The resin composition for temporary fixing may further include a thermosetting component, a curing accelerator, or another component, in addition to the above-described component.

The resin composition for temporary fixing according to the present embodiment can be used as a temporary fixing material for temporarily fixing a support for substrate conveyance to an organic substrate.

<Thermoplastic Resin>

Regarding the thermoplastic resin, a resin having thermoplasticity before the organic substrate and the support are stuck together, can be used without any particular limitations. According to the present embodiment, the thermoplastic resin may be a resin that forms a crosslinked structure by heating or the like. Examples of such a resin include a polymer having a crosslinkable functional group.

Examples of the polymer having a crosslinkable functional group include a thermoplastic polyimide resin, a (meth)acrylic copolymer having a crosslinkable functional group, a urethane resin-polyphenylene ether resin, a polyetherimide resin, a phenoxy resin, and a modified polyphenylene ether resin. Among these, a (meth)acrylic copolymer having a crosslinkable functional group is preferred.

Regarding the (meth)acrylic copolymer having a crosslinkable functional group, one obtainable by a polymerization method such as pearl polymerization or solution polymerization may be used, or a commercially available product may be used. A polymer having a crosslinkable functional group may have the crosslinkable functional group in the polymer chain or may have the crosslinkable functional group at the polymer chain ends. Specific examples of the crosslinkable functional group include an epoxy group, an alcoholic hydroxyl group, a phenolic hydroxyl group, and a carboxyl group. Among the crosslinkable functional groups, a carboxyl group is preferred. A carboxyl group can be introduced into the polymer chain by using acrylic acid.

The glass transition temperature (hereinafter, may be described as "Tg") of the thermoplastic resin is preferably −50° C. to 50° C., and more preferably −40° C. to 20° C. When the Tg is in such a range, more sufficient fluidity can be obtained while suppressing deterioration of handleability due to excessive increase in the tack force, and since the elastic modulus after curing can be lowered, the peel strength can be more effectively suppressed from becoming excessively high.

The Tg is the midpoint glass transition temperature value obtainable when a thermoplastic resin is measured using differential scanning calorimetry (DSC, for example, "Thermo Plus 2" manufactured by Rigaku Corp.). Specifically, the Tg is the midpoint glass transition temperature obtained by measuring the change in the calorific value under the conditions of a rate of temperature increase of 10° C./min and a measurement temperature of −80° C. to 80° C. and calculating the temperature according to a method equivalent to JIS K 7121:1987.

The weight average molecular weight of the thermoplastic resin is not particularly limited, and the weight average molecular weight is preferably 100000 to 1200000, and more preferably 200000 to 1000000. When the weight average molecular weight of the thermoplastic resin is in such a range, it is easy to secure film-forming properties and fluidity. The weight average molecular weight is a polystyrene-equivalent value obtained by gel permeation chromatography (GPC) using a calibration curve based on polystyrene standards.

Regarding the thermoplastic resin, one kind thereof may be used alone, or two or more kinds thereof may be used in combination.

<Thermosetting Component>

Examples of the thermosetting component include a thermosetting resin and a curing agent therefor.

Examples of the thermosetting resin include an epoxy resin, an acrylic resin, a silicone resin, a phenol resin, a thermosetting polyimide resin, a polyurethane resin, a melamine resin, and a urea resin.

The epoxy resin is not particularly limited as long as it has heat-resistant action after being cured. Regarding the epoxy resin, a bifunctional epoxy resin such as a bisphenol A type epoxy resin; a novolac type epoxy resin such as a phenol novolac type epoxy resin or a cresol novolac type epoxy resin; or the like can be used. Furthermore, regarding the epoxy resin, generally known resins such as a polyfunctional epoxy resin, a glycidylamine type epoxy resin, a heterocyclic ring-containing epoxy resin, and an alicyclic epoxy resin can be applied.

Examples of the bisphenol A type epoxy resin include jER (registered trademark) series (EPIKOTE 807, EPIKOTE 815, EPIKOTE 825, EPIKOTE 827, EPIKOTE 828, EPIKOTE 834, EPIKOTE 1001, EPIKOTE 1004, EPIKOTE 1007, and EPIKOTE 1009; "EPIKOTE" is a registered trademark) manufactured by Mitsubishi Chemical Corp.; DER-330, DER-301, and DER-361 manufactured by Dow Chemical Company; and YD8125 and YDF8170 manufactured by Nippon Steel & Sumikin Chemical Co., Ltd.

Examples of the phenol novolac type epoxy resin include EPIKOTE 152 and EPIKOTE 154 manufactured by Japan Epoxy Resins Co., Ltd.; EPPN-201 manufactured by Nippon Kayaku Co., Ltd.; and DEN-438 manufactured by Dow Chemical Company.

Examples of the o-cresol novolac type epoxy resin include EOCN-102S, EOCN-103S, EOCN-104S, EOCN-1012, EOCN-1025, and EOCN-1027 ("EOCN" is a registered trademark) manufactured by Nippon Kayaku Co., Ltd.; and YDCN701, YDCN702, YDCN703, and YDCN704 manufactured by Nippon Steel & Sumikin Chemical Co., Ltd.

Examples of the polyfunctional epoxy resin include Epon 103S manufactured by Japan Epoxy Resins Co., Ltd.; ARALDITE 0163 manufactured by Huntsman Japan K.K.; DENACOL EX-611, EX-614, EX-614B, EX-622, EX-512, EX-521, EX-421, EX-411, and EX-321 manufactured by Nagase ChemteX Corp. ("ARALDITE" and "DENACOL" are registered trademarks).

Examples of the amine type epoxy resin include EPIKOTE 604 manufactured by Japan Epoxy Resins Co., Ltd.; YH-434 manufactured by Nippon Steel & Sumikin Chemical Co., Ltd.; TETRAD-X and TETRAD-C ("TETRAD" is a registered trademark) manufactured by Mitsubishi Gas Chemical Company, Inc.; and ELM-120 manufactured by Sumitomo Chemical Co., Ltd.

Examples of the heterocyclic ring-containing epoxy resin include ARALDITE PT810 manufactured by Ciba Specialty Chemicals, Inc.; and ERL4234, ERL4299, ERL4221, and ERL4206 manufactured by UCC Holdings Co., Ltd.

The above-mentioned epoxy resins may be used singly, or two or more kinds thereof may be used in combination.

In a case where an epoxy resin is used as the thermosetting resin, it is preferable to use an epoxy resin curing agent together.

Regarding the epoxy resin curing agent, a known curing agent that is conventionally used can be used. Hereinafter, the epoxy resin curing agent and the curing agent will be collectively referred to as "thermosetting component". Examples of the epoxy resin curing agent include an amine, a polyamide, an acid anhydride, a polysulfide, boron trifluoride; a bisphenol having two or more phenolic hydroxyl groups in one molecule, such as bisphenol A, bisphenol F, or bisphenol S; and a phenol resin such as a phenol novolac resin, a bisphenol A novolac resin, or a cresol novolac resin. Particularly, from the viewpoint of having excellent electrolytic corrosion resistance during moisture absorption, the epoxy resin curing agent is preferably a phenol resin such as a phenol novolac resin, a bisphenol A novolac resin, or a cresol novolac resin.

Preferred examples among the phenol resins as the epoxy resin curing agent include products manufactured by DIC Corp., trade name: PHENOLITE LF2882, PHENOLITE LF2822, PHENOLITE TD-2090, PHENOLITE TD-2149, PHENOLITE VH-4150, and PHENOLITE VH4170; a product manufactured by Meiwa Plastic Industries, Ltd., trade name: H-1; products manufactured by Japan Epoxy Resins Co., Ltd., trade name: jER CURE MP402FPY, EPICURE YL6065, and EPICURE YLH129B65; and products manufactured by Mitsui Chemicals, Inc., trade name: MILEX XL, MILEX XLC, MILEX RN, MILEX RS, and MILEX VR ("PHENOLITE", "EPICURE", and "MILEX" are registered trademarks).

Regarding the thermosetting resin and the curing agent, one kind of each of them may be used alone, or two or more kinds thereof may be used in combination.

The content of the thermosetting resin in the resin composition for temporary fixing of the present embodiment is preferably 10 to 500 parts by mass, and more preferably 20 to 300 parts by mass, with respect to 100 parts by mass of the thermoplastic resin. When the content of the thermosetting resin is in the above-described range, the temporary fixing material can easily have sufficient low-temperature pasting property, heat resistance, curability, and peelability in combination. When the content of the thermosetting resin is 10 parts by mass or more, pasting property and heat resistance are enhanced, while at the same time, retainability of the organic substrate during the production of an electronic device is also enhanced, and there is a tendency that the component parts (for example, a semiconductor chip) constituting the electronic device are not likely to be damaged. On the other hand, when the content of the thermosetting resin is 500 parts by mass or less, the viscosity before curing is not likely to become excessively low, curing can occur in a relatively short time, and there is a tendency that it is easy to achieve both the retainability of the organic substrate and the support and the peelability between the organic substrate and the support.

<Curing Accelerator>

Examples of the curing accelerator include an imidazole, a dicyandiamide derivative, a dicarboxylic acid dihydrazide, triphenylphosphine, tetraphenylphosphonium tetraphenylborate, 2-ethyl-4-methylimidazole tetraphenylborate, and 1,8-diazabicyclo[5,4,0]undecene-7-tetraphenylborate.

When the resin composition for temporary fixing of the present embodiment includes a (meth)acrylic copolymer having an epoxy group as the thermoplastic resin, it is preferable that the resin composition for temporary fixing further contains a curing accelerator that accelerates curing of the epoxy group carried by this copolymer. Examples of such a curing accelerator include imidazoles.

Regarding the curing accelerator, one kind thereof may be used alone, or two or more kinds thereof may be used in combination.

The content of the curing accelerator in the resin composition for temporary fixing of the present embodiment is preferably 0.01 to 5.0 parts by mass with respect to a total of 100 parts by mass of the polymer having a crosslinkable functional group (thermoplastic resin) and the thermosetting resin included in the resin composition for temporary fixing. When the content of the curing accelerator is 0.01 parts by mass or more, it becomes easy to sufficiently cure the resin composition for temporary fixing by the thermal history at the time of producing a semiconductor element, and the organic substrate and the support can be fixed more reliably. On the other hand, when the content of the curing accelerator is 5.0 parts by mass or less, the melt viscosity of the resin composition for temporary fixing does not increase excessively, and storage stability is easily secured.

<Other Components>

Examples of components other than the above-described components include a filler (an inorganic filler and/or an organic filler) and a silane coupling agent.

Examples of the inorganic filler include metal fillers such as a silver powder, a gold powder, and a copper powder; and non-metal inorganic fillers such as silica, alumina, boron nitride, titania, glass, iron oxide, and ceramics. The inorganic filler can be selected according to the desired function. The metal filler can be added for the purpose of imparting thixotropic properties to the resin composition for temporary fixing. The non-metal inorganic filler can be added for the purpose of imparting low thermal expansibility and low moisture absorbability to the resin composition for temporary fixing. Regarding the inorganic filler, one kind thereof may be used alone, or two or more kinds thereof may be used in combination.

It is preferable that the inorganic filler has an organic group on the surface. As the surface of the inorganic filler is modified by means of an organic group, the dispersibility of the resin composition for temporary fixing in an organic solvent at the time of preparing a coating liquid for forming a film-shaped temporary fixing material, and the close adhesiveness and heat resistance of the film-shaped temporary fixing material thus formed can be easily enhanced.

The inorganic filler having an organic group on the surface can be obtained by, for example, mixing a silane coupling agent represented by the following General Formula (B-1) with an inorganic filler, and stirring the mixture at a temperature of 30° C. or higher. Whether the surface of the inorganic filler is modified with an organic group can be checked by UV (ultraviolet radiation) measurement, IR (infrared radiation) measurement, XPS (X-ray photoelectron spectroscopy) measurement, and the like.

(B-1)

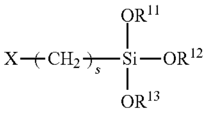

wherein in Formula (B-1), "X" represents an organic group selected from the group consisting of a phenyl group, a glycidoxy group, an acryloyl group, a methacryloyl group, a mercapto group, an amino group, a vinyl group, an isocyanate group, and a methacryloxy group; "s" represents an integer of 0 or 1 to 10; and $R^{11}$, $R^{12}$, and $R^{13}$ each independently represent an alkyl group having 1 to 10 carbon atoms.

Examples of the alkyl group having 1 to 10 carbon atoms include a methyl group, an ethyl group, a propyl group, a butyl group, a pentyl group, a hexyl group, a heptyl group, an octyl group, a nonyl group, a decyl group, an isopropyl group, and an isobutyl group. From the viewpoint that it is said to be easily available, the alkyl group having 1 to 10 carbon atoms is preferably a methyl group, an ethyl group, and a pentyl group.

From the viewpoint of heat resistance, "X" is preferably an amino group, a glycidoxy group, a mercapto group, and an isocyanate group, and more preferably a glycidoxy group and a mercapto group.

"s" in Formula (B-1) is preferably 0 to 5, and more preferably 0 to 4, from the viewpoint of suppressing fluidity of the temporary fixing material under a high temperature and enhancing heat resistance.

Preferred examples of the silane coupling agent include trimethoxyphenylsilane, dimethyldimethoxyphenylsilane, triethoxyphenylsilane, dimethoxymethylphenylsilane, vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-aminopropyltrimethoxysilane, 3-glycidoxypropyltrimethoxysilane, 3-glycidoxypropylmethyldimethoxysilane, 2-(3,4-epopxycyclohexyl)ethyltrimethoxysilane, 3-isocyanatopropyltriethoxysilane, 3-methacryloxypropyltrimethoxysilane, 3-mercaptopropyltrimethoxysilane, 3-ureidopropyltriethoxysilane, N-(1,3-dimethylbutylidene)-3-(triethoxysilyl)-1-propanamine, N,N'-bis(3-(trimethoxysilyl)propyl)ethylenediamine, polyoxyethylenepropyltrialkoxysilane, and polyethoxydimethylsiloxane. Among these, 3-aminopropyltriethoxysilane, 3-glycidoxypropyltrimethoxysilane, 3-isocyanatopropyltriethoxysilane, and 3-mercaptopropyltrimethoxysilane are preferred, and trimethoxyphenylsilane, 3-glycidoxypropyltrimethoxysilane, and 3-mercaptopropyltrimethoxysilane are more preferred.

Regarding the silane coupling agent, one kind thereof may be used alone, or two or more kinds thereof may be used in combination.

From the viewpoint of attempting a balance between the heat resistance-enhancing effect and the storage stability, the amount of use of the coupling agent is preferably 0.01 to 50 parts by mass, and more preferably 0.05 parts by mass to 20 parts by mass, with respect to 100 parts by mass of the inorganic filler, and from the viewpoint of enhancing heat resistance, the amount of use is even more preferably 0.5 to 10 parts by mass.

The content of the inorganic filler in the resin composition for temporary fixing of the present embodiment is preferably 300 parts by mass or less, more preferably 200 parts by mass or less, and even more preferably 100 parts by mass or less, with respect to 100 parts by mass of the thermoplastic resin, from the viewpoints of enhancing the handleability of the film-shaped temporary fixing material in the state of B-stage and enhancing the low thermal expansibility. The lower limit of the content of the inorganic filler is not particularly limited, and it is preferable that the lower limit is 5 parts by mass or more with respect to 100 parts by mass of the thermoplastic resin. When the content of the inorganic filler is adjusted to the above-described range, there is a tendency that desired functions can be imparted while sufficiently securing adhesiveness to the organic substrate.

Examples of the organic filler include carbon, a rubber-based filler, silicone-based microparticles, polyamide microparticles, and polyimide microparticles.

The content of the organic filler in the resin composition for temporary fixing of the present embodiment is preferably 300 parts by mass or less, more preferably 200 parts by mass or less, and even more preferably 100 parts by mass or less, with respect to 100 parts by mass of the thermoplastic resin. The lower limit of the content of the organic filler is not particularly limited, and it is preferable that the lower limit is 5 parts by mass or more with respect to 100 parts by mass of the thermoplastic resin. When the content of the organic filler is adjusted to the above-described range, there is a tendency that desired functions can be imparted while sufficiently securing adhesiveness to the organic substrate.

It is preferable that the resin composition for temporary fixing of the present embodiment either includes no silicone-based release agent or has a content of the silicone-based release agent of 10% by mass or less based on the total amount of the resin composition for temporary fixing.

<Silicone-Based Release Agent>

The silicone-based release agent may be a silicone compound having a polysiloxane structure, and examples include a silicone-modified resin, a straight silicone oil, a non-reactive, modified silicone oil, and a reactive, modified silicone oil.

Examples of the silicone-modified resin include a silicone-modified alkyd resin. Examples of the modified silicone oils include a polyether-modified silicone, an alkyl-modified silicone, and an epoxy-modified silicone.

Examples of commercially available products of the above-mentioned silicone compounds include trade names: SH3773M, L-7001, SH-550, and SH-710 manufactured by Dow Corning Toray Co., Ltd.; trade names: X-22-163, KF-105, X-22-163B, and X-22-163C manufactured by Shin-Etsu Chemical Co., Ltd.; and trade name: BYK-UV3500 manufactured by BYK Chemie GmbH.

When the resin composition for temporary fixing of the present embodiment contains a silicone-based release agent, the silicone-based release agents can be used singly or in combination of two or more kinds thereof.

With regard to the resin composition for temporary fixing of the present embodiment, from the viewpoint of suppressing contamination of the organic substrate, it is preferable that the content of the silicone-based release agent is 10% by mass or less, more preferably 5% by mass or less, and even more preferably 2% by mass or less, based on the total amount of the resin composition for temporary fixing, and it is particularly preferable that the resin composition for temporary fixing does not include a silicone-based release agent. In particular, it is preferable that the total content of the silicone-based release agent, which does not have a reactive functional group and is a straight silicone or non-reactive, modified silicone, is 10% by mass or less, more preferably 5% by mass or less, even more preferably 2% by mass or less, and still more preferably 0% by mass, based on the total amount of the resin composition for temporary fixing.

The resin composition for temporary fixing according to the present embodiment is preferably such that when the resin composition for temporary fixing is formed into a film shape, the shear viscosity at 60° C. is 100 to 10000 Pa·s, the elastic modulus after being heated for 30 minutes at 130° C. and for 1 hour at 170° C. is 10 to 1000 MPa at 25° C., and the 5% weight reduction temperature after being heated for 30 minutes at 130° C. and for 1 hour at 170° C. is 300° C. or higher.

The shear viscosity is measured by the following procedure. First, four sheets of a film of the resin composition for temporary fixing having a thickness of 60 μm are laminated at 80° C. to produce a sample for measurement having a thickness of 240 μm. This sample for measurement is heated from 35° C. to 200° C. at a rate of temperature increase of 20° C./min while applying 5% strain using a rotary viscoelasticity analyzer (manufactured by TA Instruments, Inc., ARES) set under the following conditions, and the viscosity at the time of reaching 60° C. is measured.

Measurement method: "parallel plate"

Measurement jig: Circular jig having a diameter of 8 mm

Measurement mode: "Dynamic temperature ramp"

Frequency: 1 Hz

The elastic modulus after heating is measured by the following procedure. First, four sheets of a film of the resin composition for temporary fixing having a thickness of 60 μm are laminated at 80° C. to produce a film having a thickness of 240 μm. This is heated under predetermined conditions (for example, heated for 30 minutes in an oven at 130° C. and for 1 hour at 170° C.) and then is cut out into a size of 4 mm in the thickness direction and 33 mm in width and length. The cut film is mounted on a dynamic viscoelasticity apparatus (product name: Rheogel-E4000, manufactured by UMB), a tensile load is applied thereto, the elastic modulus is measured at a frequency of 10 Hz and a rate of temperature increase of 3° C./min, and the measured value at 25° C. is recorded.

The 5% weight reduction temperature after heating is measured by the following procedure. First, four sheets of a film of the resin composition for temporary fixing having a thickness of 60 μm are laminated at 80° C. to produce a film having a thickness of 240 μm. This is heated under predetermined conditions (for example, heated for 30 minutes in an oven at 130° C. and for 1 hour at 170° C.), and then 10 mg of the film is cut out as a measurement sample. The 5% weight reduction temperature can be determined by measuring this measurement sample using a differential thermal balance (manufactured by Seiko Instruments, Inc., TG/DTA220) at a rate of temperature increase of 10° C./min.

From the viewpoint of laminating properties, the shear viscosity at 60° C. is more preferably 1000 to 9000 Pa·s, even more preferably 2000 to 8000 Pa·s, and still more preferably 3000 to 7000 Pa·s.

The shear viscosity at 60° C. can be adjusted by, for example, changing the Tg and the molecular weight of the thermoplastic resin, changing the softening point temperature and the molecular weight of the thermosetting resin, changing the blending proportions of the thermoplastic resin and the thermosetting resin, adding a filler and a resin, and the like.

From the viewpoints of peelability and rigidity, the elastic modulus at 25° C. after heating is more preferably 50 to 980 MPa, even more preferably 100 to 960 MPa, and still more preferably 200 to 940 MPa.

The elastic modulus at 25° C. after heating can be adjusted by, for example, changing the Tg, the molecular weight, and the number of functional groups of the thermoplastic resin, changing the number of functional groups of the thermosetting resin, changing the blending proportions of the thermoplastic resin and the thermosetting resin, adding a filler and a resin, and the like.

From the viewpoint of heat resistance, the 5% weight reduction temperature after heating is more preferably 260°

C. to 600° C., even more preferably 280° C. to 550° C., and still more preferably 300° C. to 500° C.

The 5% weight reduction temperature after heating can be adjusted by, for example, changing the Tg, the molecular weight, and the number of functional groups of the thermoplastic resin, changing the number of functional groups of the thermosetting resin, changing the blending proportions of the thermoplastic resin and the thermosetting resin, adding a filler and a resin, and the like.

The resin composition for temporary fixing according to the present embodiment is such that after the resin composition for temporary fixing is formed into a film shape, laminated on a substrate having a surface of solder resist AUS308, and heated for 30 minutes at 130° C. and for 1 hour at 170° C., the 90° peel strength at 25° C. between the film and the substrate may be 30 to 300 N/m, 40 to 250 N/m, or 50 to 200 N/m. When the 90° peel strength is in the above-described range, the organic substrate and the temporary fixing material are not likely to be detached, packaging and sealing of a semiconductor chip on an organic substrate that has been reinforced with a support are further facilitated, and also, the temporary fixing material and the support can be easily peeled from the organic substrate.

The 90° peel strength is measured as follows. A substrate (material: glass epoxy substrate, substrate thickness: 1000 μm) having a surface of solder resist "PSR-4000 AUS308" (manufactured by Taiyo Ink Manufacturing Co., Ltd., product name) is placed on a stage of a roll laminator (manufactured by Taisei Laminator Co., Ltd., FAST LAMINATOR VA-400III), and a resin composition for temporary fixing that has been formed into a film shape having a thickness of 60 μm is installed so as to be pasted to the substrate. This is pasted under the conditions of a speed of 0.2 m/min, a temperature of 80° C., and a pressure of 0.2 MPa, and a sample for measurement is obtained. The obtained sample for measurement is heated under predetermined heating conditions (for example, heated for 30 minutes at 130° C. and for 1 hour at 170° C.) and then cut out into a size of 10 mm in width. This is subjected to a peel test at a rate of 300 mm/min using a peel testing machine set to have a peel angle of 90°, and the peel strength at that time is designated as 90° peel strength.

Furthermore, the resin composition for temporary fixing according to the present embodiment is such that after the resin composition for temporary fixing is formed into a film shape and laminated on a substrate having a surface of solder resist AUS308, and heated for 30 minutes at 130° C., for 1 hour at 170° C., and for 5 minutes at 260° C., the 90° peel strength at 25° C. between the film and the support may be 30 to 300 N/m, 40 to 250 N/m, or 50 to 200 N/m.

The resin composition for temporary fixing of the present embodiment can form a film-shaped temporary fixing material. In this case, it becomes easier to control the film thickness of the temporary fixing material, and the thickness fluctuation in a laminated body of the organic substrate, the temporary fixing material, and the support can be reduced. Furthermore, the film-shaped temporary fixing material can be stuck onto an organic substrate or a support by a convenient method such as lamination and has excellent workability.

The thickness of the film-shaped temporary fixing material is not particularly limited, and from the viewpoint of sufficiently fixing the organic substrate and a support for conveyance, the thickness is preferably 10 to 350 μm. When the thickness is 10 μm or more, the thickness fluctuation during application is reduced, and since the thickness is sufficient, the strength of the temporary fixing material or a cured product of the temporary fixing material is improved so that the organic substrate and the support for conveyance can be more sufficiently fixed. When the thickness is 350 μm or less, thickness fluctuation of the temporary fixing material is not likely to occur, it is easy to reduce the amount of residual solvent in the temporary fixing material by sufficiently drying, and foam formation when heating a cured product of the temporary fixing material can be further reduced.

[Support Tape for Substrate Conveyance]

The support tape for substrate conveyance of the present embodiment includes a support film for conveying an organic substrate; and a temporary fixing material layer provided on the support film for temporarily fixing the organic substrate and the support film.

The temporary fixing material layer contains a thermoplastic resin and either includes no silicone-based release agent or has a content of a silicone-based release agent of 10% by mass or less based on the total amount of the temporary fixing material, and the temporary fixing material layer may have a shear viscosity of 100 to 10000 Pa·s at 60° C., an elastic modulus of 10 to 1000 MPa at 25° C. after being heated for 30 minutes at 130° C. and for 1 hour at 170° C., and a 5% weight reduction temperature of 300° C. or higher after being heated for 30 minutes at 130° C. and for 1 hour at 170° C. Such a temporary fixing material layer can be formed from the above-mentioned resin composition for temporary fixing of the present embodiment.

FIG. 1 is diagrams illustrating an embodiment of the support tape for substrate conveyance, and FIG. 1(A) is a top view, while FIG. 1(B) is a schematic cross-sectional view taken along the line I-I of FIG. 1(A). The support tape for substrate conveyance 10 illustrated in these diagrams includes a support film 1; a temporary fixing material layer 2A formed from the resin composition for temporary fixing of the present embodiment; and a protective film 3, in this order.

The support film 1 is not particularly limited as long as it can convey an organic substrate, and examples include a polyethylene terephthalate film, a polybutylene terephthalate film, a polyethylene naphthalate film, a polyethylene film, a polypropylene film, a polyamide film, and a polyimide film. Among these, from the viewpoint of having excellent flexibility and toughness, a polyethylene terephthalate film, a polybutylene terephthalate film, a polyethylene naphthalate film, a polypropylene film, a polyamide film, and a polyimide film are preferred, and from the viewpoints of heat resistance, a polyimide film and a polyethylene naphthalate film are more preferred.

The thickness of the support film 1 can be appropriately set according to the intended strength and flexibility, and the thickness is preferably 3 to 350 μm. When the thickness is 3 μm or more, sufficient film strength tends to be obtained, and when the thickness is 350 μm or less, sufficient flexibility tends to be obtained. From such a viewpoint, the thickness of the support film 1 is more preferably 5 to 200 μm, and even more preferably 7 to 150 μm.

The protective film 3 is not particularly limited, and examples include a polyethylene terephthalate film, a polybutylene terephthalate film, a polyethylene naphthalate film, a polyethylene film, and a polypropylene film. Regarding the protective film 3, from the viewpoints of flexibility and toughness, a polyethylene terephthalate film, a polyethylene film, and a polypropylene film are preferred. Furthermore, from the viewpoint of enhancing the peelability from the temporary fixing material layer, it is preferable to use a film that has been subjected to a mold release treatment using a silicone-based compound, a fluorine-based compound, or the like, as the protective film 3.

The thickness of the protective film 3 can be appropriately set according to the intended strength and flexibility, and for example, the thickness is preferably 10 to 350 μm. When the thickness is 10 μm or more, sufficient film strength tends to be obtained, and when the thickness is 350 μm or less, sufficient flexibility tends to be obtained. From such a viewpoint, the thickness of the protective film 3 is more preferably 15 to 200 μm, and even more preferably 20 to 150 μm.

The temporary fixing material layer 2A can be formed by a method of mixing and kneading the various components constituting the above-mentioned resin composition for temporary fixing of the present embodiment in an organic solvent to prepare a varnish, applying the produced varnish on a support film 1, and drying the varnish.

The organic solvent is not particularly limited and can be determined by considering the volatility and the like during film formation from the boiling point. Specifically, from the viewpoint of making the curing of the film during film formation difficult to proceed, a solvent having a relatively low boiling point, such as methanol, ethanol, 2-methoxyethanol, 2-ethoxyethanol, 2-butoxyethanol, methyl ethyl ketone, acetone, methyl isobutyl ketone, toluene, or xylene, is preferred. Furthermore, for the purpose of enhancing the film-forming properties and the like, for example, it is preferable to use a solvent having a relatively high boiling point, such as dimethylacetamide, dimethylformamide, N-methylpyrrolidone, or cyclohexanone. These solvents may be used singly, or two or more kinds thereof may be used in combination. The solid content concentration in the varnish is preferably 10% to 80% by mass.

Mixing and kneading can be carried out by using conventional dispersing machines such as a stirrer, a Raikai mixer, a three-roll, and a ball mill, and appropriately combining these. Drying is not particularly limited as long as it is performed under the conditions in which the organic solvent used is sufficiently volatilized, and the drying can be carried out usually by heating at 60° C. to 200° C. for 0.1 to 90 minutes.

The support tape for substrate conveyance 10 can be obtained by forming the temporary fixing material layer 2A on the support film 1 and then pasting the protective film 3 onto the temporary fixing material layer 2A.

The support tape for substrate conveyance 10 can be easily stored by, for example, winding into a roll shape. Furthermore, the roll-shaped support tape for substrate conveyance 10 can also be stored in a state of being cut into an adequate size.

Figure 2:
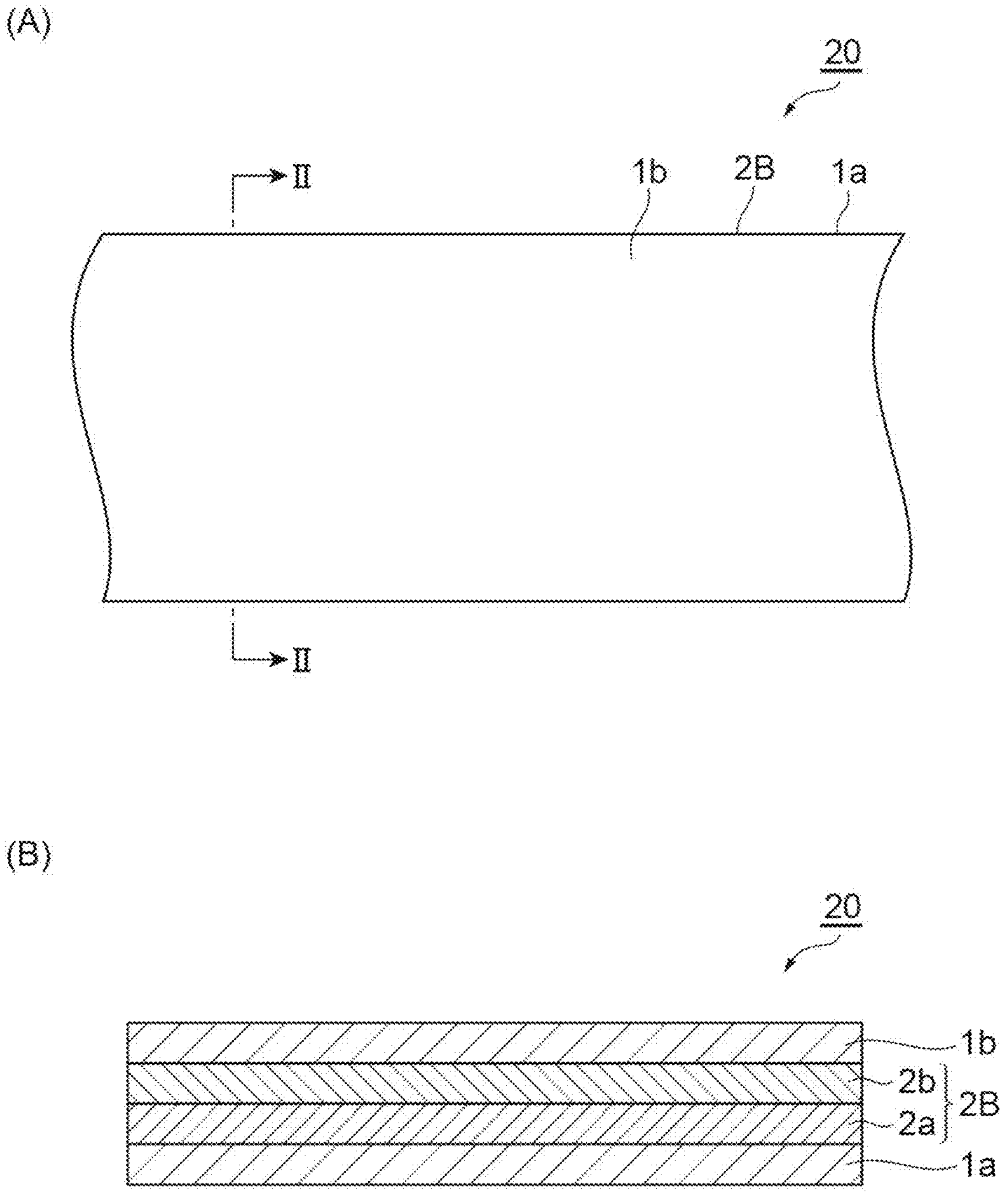
FIG. 2 is diagrams illustrating another embodiment of the support tape for substrate conveyance.

FIG. 2 is diagrams illustrating another embodiment of the support tape for substrate conveyance, and FIG. 2(A) is a top view, while FIG. 2(B) is a schematic cross-sectional view taken along the line II-II of FIG. 2(A). The support tape for substrate conveyance 20 illustrated in these diagrams includes a support film 1*a*; a temporary fixing material layer 2B composed of a first resin layer 2*a* and a second resin layer 2*b*; and a support film 1*b*, in this order.

The first resin layer 2*a* and the second resin layer 2*b* may be composed of the same composition or may be composed of compositions different from each other. In a case where the first resin layer 2*a* and the second resin layer 2*b* are composed of different compositions, for example, when the second resin layer 2*b* is assumed to be on the side in contact with the organic substrate, the support film 1*a* can be used as a support film for conveyance. In this case, by having the second resin layer 2*b* composed of the resin composition for temporary fixing of the present embodiment, it is possible to achieve both sufficient fixation of the organic substrate and the support film for conveyance and easy peeling of the support film for conveyance from the organic substrate. The first resin layer 2*a* can be designed to have excellent adhesiveness to the support film 1*a*, which is the support film for conveyance.

The temporary fixing material layer 2B can be formed by mixing and kneading the above-mentioned components in an organic solvent to prepare a varnish, producing a laminated body by applying and then drying this varnish on the support film 1*a*, producing another laminated body by applying and then drying a varnish identical to the above-described one or a varnish prepared separately on the support film 1*b*, and pasting the laminated bodies together. In the case of forming the first resin layer 2*a* and the second resin layer 2*b* with the same varnish, there is an advantage that even when a relatively thick temporary fixing material layer is formed, the residual amount of the organic solvent can be easily reduced sufficiently. The first resin layer 2*a* and the second resin layer 2*b* may be integrated to form a single-layer structure or may maintain a two-layer structure with an interface existing between the two layers.

[Method for Producing Electronic Device]

The method for producing an electronic device using the resin composition for temporary fixing according to the present embodiment can include the following roughly divided five steps:

(a) a first step of pasting a support to an organic substrate having a thickness of 1000 μm or less, with a temporary fixing material interposed therebetween, to obtain a laminated body;

(b) a second step of heating the temporary fixing material of the laminated body;

(c) a third step of mounting a semiconductor chip on the organic substrate of the laminated body that has been subjected to the second step;

(d) a fourth step of sealing the semiconductor chip mounted on the organic substrate with a sealing material; and (e) a fifth step of peeling the support and the temporary fixing material from the organic substrate of the laminated body that has been subjected to the fourth step.

Figure 3:
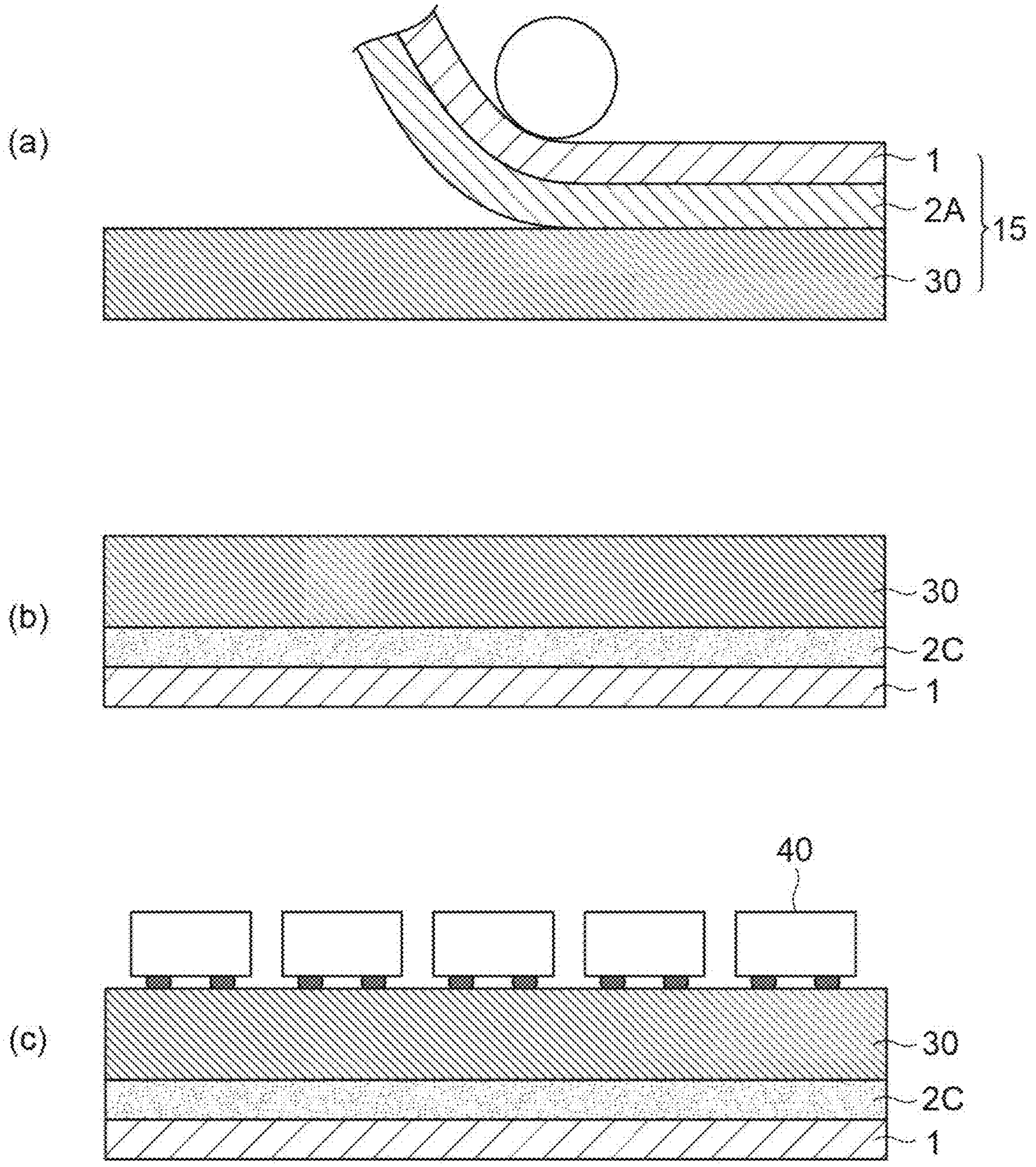
FIG. 3(*a*) to FIG. 3(*c*) are schematic cross-sectional views for describing an embodiment of a method for producing an electronic device.
Figure 4:
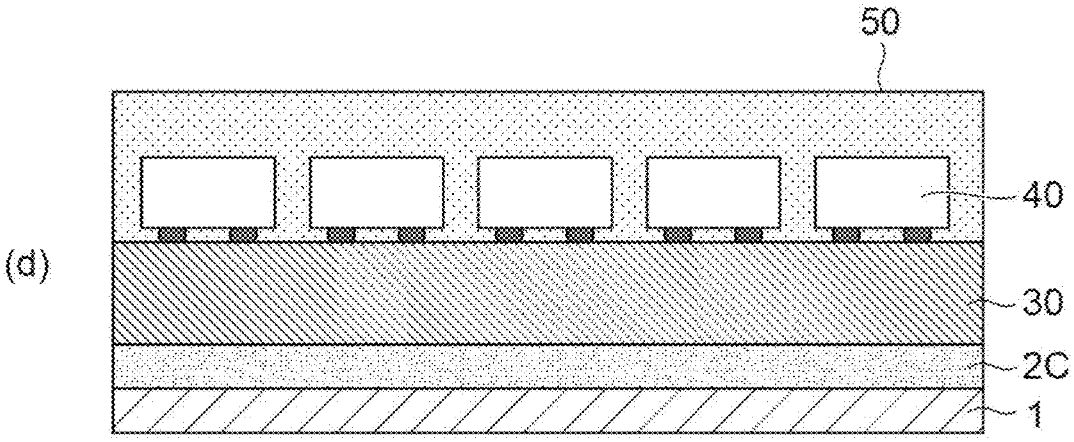
FIG. 4(*d*) and FIG. 4(*e*) are schematic cross-sectional views for describing an embodiment of the method for producing an electronic device.
Figure 4:
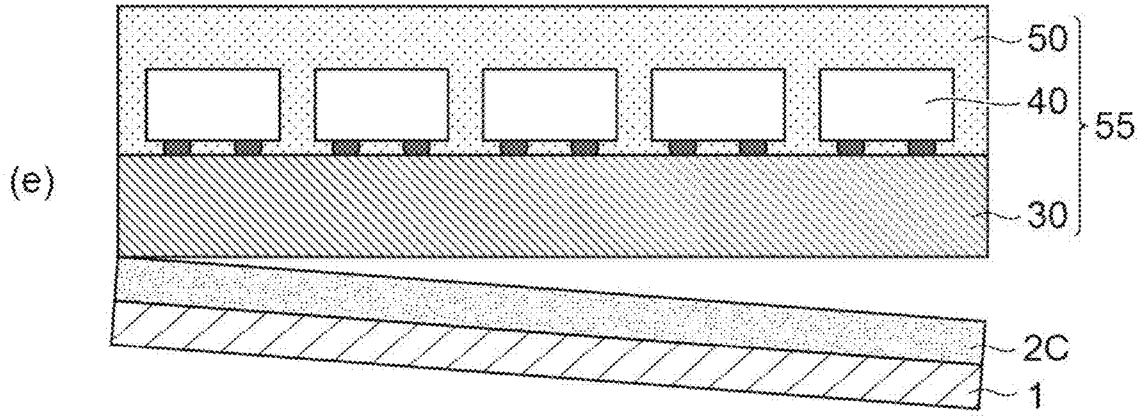
Figure 5:
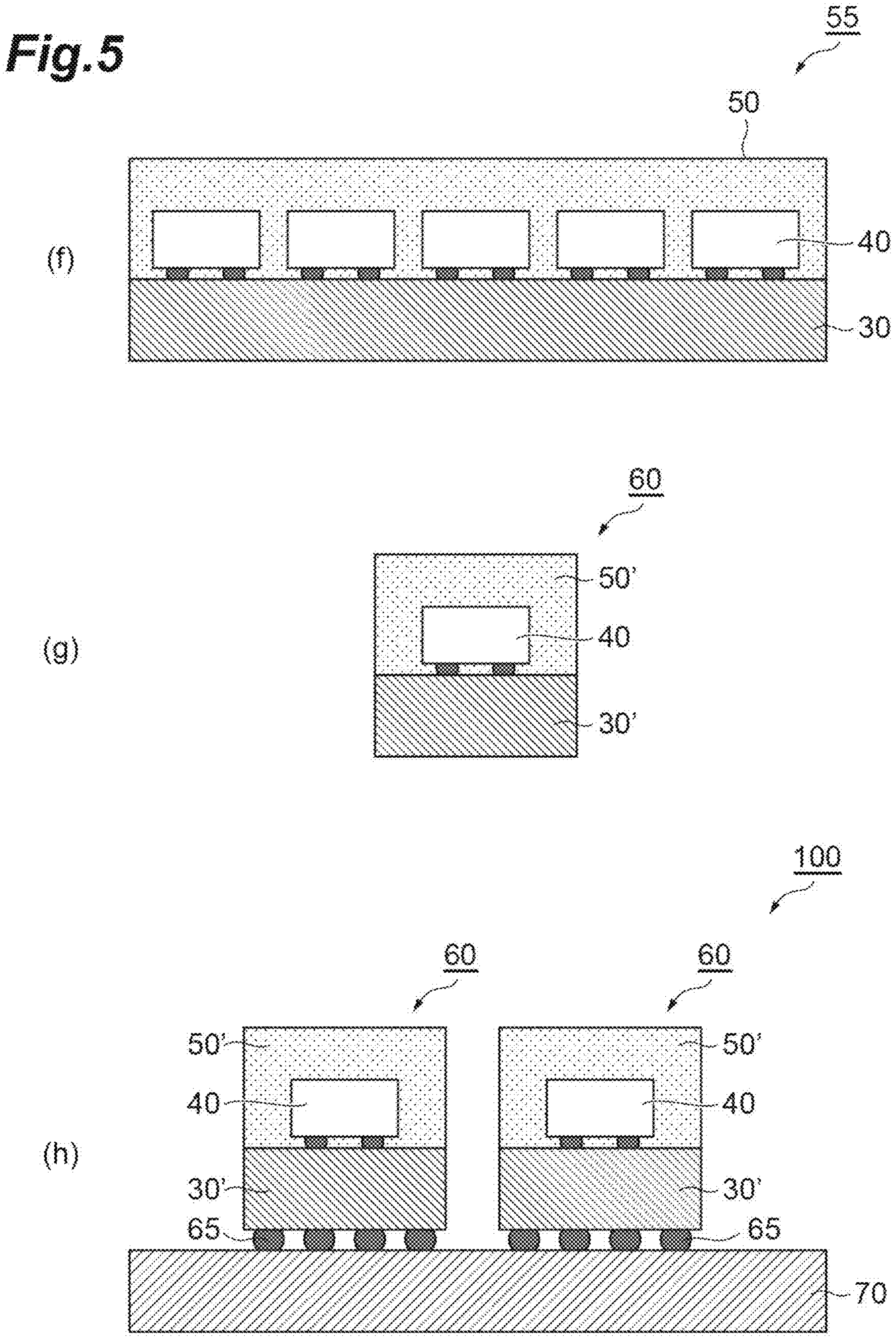
FIG. 5(*f*) to FIG. 5(*h*) are schematic cross-sectional views for describing an embodiment of the method for producing an electronic device.

FIG. 3, FIG. 4, and FIG. 5 are schematic cross-sectional views for explaining an embodiment of the method for producing an electronic device. Incidentally, in FIG. 3, FIG. 4, and FIG. 5, the case in which the temporary fixing material (temporary fixing material layer) is the temporary fixing material layer 2A of the support tape for substrate conveyance 10 illustrated in FIG. 1(B) is illustrated; however, the configuration of the temporary fixing material is not limited to this.

<(a) First Step>

In the first step, a laminated body 15 is obtained by pasting a support film 1 to an organic substrate 30, with a temporary fixing material layer 2A interposed therebetween (FIG. 3(*a*)).

As the organic substrate 30, for example, a substrate having a thickness of 1000 μm or less can be used. From the viewpoint of reducing the thickness of a semiconductor element or an electronic device, the thickness of the organic substrate 30 may be 500 μm or less, may be 300 μm or less, or may be 200 μm or less. The thickness of the organic substrate 30 may be 10 μm or more or may be 30 μm or more.

The organic substrate 30 may be a substrate formed from an organic substance such as a polymer or may have an organic substance at least in a portion or the entirety of the principal surfaces. Examples of the organic substance include a photosensitive insulating material and a cured product thereof, and a photosensitive solder resist and a cured product thereof (solder resist). When the organic substrate 30 has a photosensitive insulating material or a cured product thereof, or a photosensitive solder resist or a cured product thereof (solder resist), in a portion or the entirety of the surface, the substrate that serves as the core may be a glass epoxy substrate obtained by impregnating a glass cloth with an epoxy resin, or the like. Furthermore, the organic substrate 30 may be a coreless substrate. Examples of the material of the coreless substrate include a thermoplastic resin such as a polyimide resin, a thermosetting resin such as an epoxy resin, and a resin composition including one kind or two or more kinds of these resins (for example, a buildup material).

As illustrated in FIG. 3(*a*), in a case of obtaining a laminated body 15 using the support tape for substrate conveyance 10, the organic substrate 30 and the support film 1 can be laminated, with the temporary fixing material layer 2A interposed therebetween, using a roll laminator. When the support tape for substrate conveyance 10 includes a protective film 3, the protective film 3 may be torn off before lamination, and the temporary fixing material layer 2A and the support film 1 may be laminated while tearing off the protective film 3.

Regarding the roll laminator, for example, a roll laminator VA400III (trade name) manufactured by Taisei Laminator Co., Ltd. may be mentioned. In a case of using this apparatus, the organic substrate 30 and the support film 1 can be stuck together, with the temporary fixing material layer 2A interposed therebetween, at a pressure of 0.1 MPa to 1.0 MPa, a temperature of 40° C. to 150° C., and a velocity of 0.1 to 1.0 m/min.

In the present embodiment, the support tape for substrate conveyance 10, which is in a tape form, can be continuously supplied. In this case, the organic substrate 30 reinforced by the support film 1 in a tape form can be continuously conveyed, and an enhancement of productivity and the like can be attempted.

A vacuum laminator can also be used instead of a roll laminator.

Examples of the vacuum laminator include a vacuum laminator LM-50X50-S (trade name) manufactured by NPC, Inc., and a vacuum laminator V130 (trade name) manufactured by Nichigo Morton Co., Ltd. Regarding the lamination conditions, the organic substrate 30 and the support film 1 can be stuck together, with the temporary fixing material layer 2A interposed therebetween, at an atmospheric pressure of 1 hPa or lower, a pressure-bonding temperature of 40° C. to 150° C. (preferably 60° C. to 120° C.), a lamination pressure of 0.01 to 0.5 MPa (preferably 0.1 to 0.5 MPa), and a retention time of 1 second to 600 seconds (preferably 30 seconds to 300 seconds).

<(b) Second Step>

In the second step, the temporary fixing material layer 2A of the laminated body 15 is heated. As a result of this step, the organic substrate 30 and the support film 1 are sufficiently fixed by a cured temporary fixing material layer 2C (FIG. 3(*b*)), and the handleability of the organic substrate 30 is enhanced.

Heating can be carried out by, for example, using an explosion-proof dryer or a constant-temperature forced convection dryer (manufactured by Yamato Scientific Co., Ltd., DKN602). Regarding the heating conditions, curing at 100° C. to 200° C. for 10 to 300 minutes (more preferably 20 to 210 minutes) is preferred. When the temperature is 100° C. or higher, the temporary fixing material is sufficiently cured so that problems are not likely to occur in the subsequent steps, and when the temperature is 200° C. or lower, outgases are not likely to be generated during curing of the temporary fixing material, while peeling of the temporary fixing material can be further suppressed. Furthermore, when the heating time is 10 minutes or longer, problems are not likely to occur in the subsequent steps, and when the heating time is 300 minutes or shorter, the operation efficiency is not likely to be deteriorated. The temporary fixing material layer 2C in FIG. 3(*b*) represents a cured body of the temporary fixing material layer 2A.

<(c) Third Step>

In the third step, a semiconductor chip is mounted on the organic substrate of the laminated body that has been subjected to the second step. For example, a semiconductor chip 40 can be packaged on the organic substrate 30 by using a flip-chip bonder (FIG. 3(*c*)). Examples of the packaging apparatus include FC3000L (trade name) manufactured by Toray Engineering Co., Ltd., and the packaging conditions can be optionally selected in accordance with the desired organic substrate and the semiconductor chip.

<(d) Fourth Step>

In the fourth step, as illustrated in FIG. 4(*d*), the semiconductor chip 40 mounted on the organic substrate 30 is sealed with a sealing material 50. Examples of the sealing apparatus include FFT1030G (trade name) manufactured by TOWA Corp., and the sealing conditions can be optionally selected in accordance with the desired organic substrate, semiconductor chip, and sealing material. Furthermore, the curing conditions for the sealing material after sealing can be optionally selected according to the type of the sealing material.

<(e) Fifth Step>

In the fifth step, as illustrated in FIG. 4(*e*), the support film 1 and the temporary fixing material layer 2C are peeled from the organic substrate 30 of the laminated body that has been subjected to the fourth step. Examples of the method for peeling include a method of horizontally fixing either of the semiconductor chip-packaged substrate, where a semiconductor chip is mounted on an organic substrate and sealed, and the support film, and lifting the other one at a certain angle; and a method of attaching a protective film on the sealed surface of the semiconductor chip-packaged substrate, and peeling the semiconductor chip-packaged substrate and the protective film from the support film by a peeling method.

These methods for peeling are usually carried out at room temperature; however, these methods may also be carried out at a temperature of about 40° C. to 100° C.

According to the present embodiment, when the temporary fixing material partially remains on the semiconductor chip-packaged substrate, a cleaning process for removing this can be provided. The removal of the temporary fixing material can be carried out by, for example, cleaning the semiconductor chip-packaged substrate.

The cleaning liquid is not particularly limited as long as it is a cleaning liquid capable of removing the partially remaining temporary fixing material. Examples of such a cleaning liquid include the above-described organic solvents that can be used for diluting the resin composition for temporary fixing. These organic solvents can be used singly, or two or more kinds thereof may be used in combination.

Furthermore, in a case where it is difficult to remove the remaining temporary fixing material, a base or an acid may be added to the organic solvent. Examples of the base that can be used include amines such as ethanolamine, diethanolamine, triethanolamine, triethylamine, and ammonia; and ammonium salts such as tetramethylammonium hydroxide. Examples of the acid that can be used include organic acids such as acetic acid, oxalic acid, benzenesulfonic acid, and dodecylbenzenesulfonic acid. The amount of addition is preferably 0.01% to 10% by mass as the concentration in the cleaning liquid. Furthermore, existing surfactants may also be added to the cleaning liquid in order to enhance the removability of the residue.

The method for cleaning is not particularly limited, and examples include a method of performing cleaning with a paddle using the above-described cleaning liquid, a method of cleaning by spraying, and a method of immersing in a cleaning liquid tank. The temperature is suitably 10° C. to 80° C., and preferably 15° C. to 65° C., finally washing with water or washing with alcohol is performed, and a drying treatment is performed to obtain a semiconductor chip-packaged substrate.

Incidentally, as described above, according to the resin composition for temporary fixing according to the present embodiment, since peeling from the organic substrate can be satisfactorily carried out, and contamination caused by silicone-based release agents can be sufficiently reduced, it is possible to omit or simplify the cleaning process.

According to the present embodiment, the semiconductor chip-packaged substrate 55 having a semiconductor chip packaged and sealed thereon is further singularized into semiconductor elements 60 by dicing (FIG. 5(*f*) and FIG. 5(*g*)).

FIG. 5(*h*) is a cross-sectional view schematically illustrating an electronic device 100 produced through the above-described processes. The electronic device 100 has a plurality of semiconductor elements 60 disposed on a wiring board 70 by means of solder balls 65. The electronic device of the present embodiment can be referred to as a semiconductor device.

Thus, embodiments of the present invention have been described; however, the present invention is not necessarily limited to the above-mentioned embodiments, and modifications may be appropriately made to the extent that does not depart from the purport of the present invention. The resin composition for temporary fixing, the support tape for substrate conveyance, and the method for producing an electronic device according to the present invention are applicable in order to reduce the sizes of general electronic devices. Examples of the electronic devices include an AP (application processor), a GPU (graphic processing unit), a memory system (DRAM, NAND), and smartphones and tablet-type terminals including the above-mentioned devices.

EXAMPLES

Hereinafter, the present invention will be more specifically described by way of Examples and Comparative Examples; however, the present invention is not intended to be limited to the following Examples.

[Synthesis of Acrylic Rubber K-1]

In a 500-cc separable flask equipped with a stirrer, a thermometer, a nitrogen purging device (nitrogen inflow tube), and a reflux condenser with a water receptor, 200 g of deionized water, 60 g of butyl acrylate, 10 g of methyl methacrylate, 10 g of 2-hydroxyethyl methacrylate, 20 g of glycidyl methacrylate, 1.94 g of a 1.8% aqueous solution of polyvinyl alcohol, 0.2 g of lauryl peroxide, and 0.08 g of n-octylmercaptan were blended. Subsequently, $N_2$ gas was blown into the flask for 60 minutes to remove air in the system, subsequently the temperature inside the system was raised to 65° C., and then polymerization was performed for 5 hours. Furthermore, the temperature inside the system was raised to 90° C., subsequently stirring was continued for 2 hours, and polymerization was completed. Transparent beads obtained by the polymerization reaction were separated by filtration, cleaned with deionized water, and then dried in a vacuum dryer at 50° C. for 6 hours, and acrylic rubber K-1 was obtained.

The weight average molecular weight of the acrylic rubber K-1 was measured by GPC, and the weight average molecular weight was 300000 as calculated relative to polystyrene standards. Furthermore, the Tg of the acrylic rubber K-1 was −20° C.

[Synthesis of Acrylic Rubber K-2]

In a 500-cc separable flask equipped with a stirrer, a thermometer, a nitrogen purging device (nitrogen inflow tube), and a reflux condenser with a water receptor, 200 g of deionized water, 70 g of butyl acrylate, 10 g of methyl methacrylate, 10 g of 2-hydroxyethyl methacrylate, 10 g of glycidyl methacrylate, 1.94 g of a 1.8% aqueous solution of polyvinyl alcohol, 0.2 g of lauryl peroxide, and 0.06 g of n-octylmercaptan were blended. Subsequently, $N_2$ gas was blown into the flask over 60 minutes to remove air in the system, subsequently the temperature inside the system was raised to 65° C., and then polymerization was performed for 5 hours. Furthermore, the temperature inside the system was raised to 90° C., subsequently stirring was continued for 2 hours, and polymerization was completed. Transparent beads obtained by the polymerization reaction were separated by filtration, cleaned with deionized water, and dried in a vacuum dryer at 50° C. for 6 hours, and acrylic rubber K-2 was obtained.

The weight average molecular weight of the acrylic rubber K-2 was measured by GPC, and the weight average molecular weight was 400000 as calculated relative to polystyrene standards. Furthermore, the Tg of the acrylic rubber K-2 was −28° C.

Examples 1 to 5 and Comparative Examples 1 to 3

[Production of Support Tape for Substrate Conveyance]

Varnishes for forming a temporary fixing material layer were each prepared at the compositions in parts by mass as indicated in Tables 1 and 2. Each of the prepared vanishes was applied on a polyimide film (manufactured by Ube Industries, Ltd., UPILEX 25-SGA, thickness 25 μm), and the varnish was dried by heating for 5 minutes at 90° C. and for 5 minutes at 120° C. to form a temporary fixing material layer having a thickness of 60 μm. Subsequently, a protective film was stuck onto the temporary fixing material layer, and a support tape for substrate conveyance having a configuration of a support film, a temporary fixing material layer, and a protective film was obtained.

TABLE 1

| | | Example 1 | Example 2 | Example 3 | Example 4 | Example 5 |
|---|---|---|---|---|---|---|
| Thermoplastic resin | Acrylic rubber K-1 | — | — | 100 | — | — |
| | Acrylic rubber K-2 | 100 | 100 | — | 100 | 100 |
| Thermosetting component | N500P-10 | 20 | 40 | 20 | 20 | 20 |
| | EXA-830CRP | 10 | 20 | 10 | 10 | 10 |
| | MEH-7800M | 20 | 40 | 20 | 20 | 20 |
| Silicone compound | TA31-209E | — | — | — | 1 | — |
| | SH3773M | — | — | — | — | 1 |
| Curing accelerator | 2PZ-CN | 0.04 | 0.04 | 0.04 | 0.04 | 0.04 |
| Non-volatile fraction (% by mass) | | 35 | 35 | 35 | 35 | 35 |
| Solvent: Cyclohexanone | | | | | | |

TABLE 2

| | | Comparative Example 1 | Comparative Example 2 |
|---|---|---|---|
| Thermoplastic resin | HTR-860P-3CSP | 100 | 100 |
| Curable component | N500P-10 | 30 | 30 |
| | EXA-830CRP | 90 | 90 |
| | MEH-7800M | 90 | 90 |
| Silicone compound | TA31-209E | 40 | — |
| | SH3773M | 10 | |
| Curing accelerator | 2PZ-CN | 0.4 | 0.4 |
| Non-volatile fraction (% by mass) | | 35 | 35 |
| Solvent: Cyclohexanone | | | |

The details of each of the components described in Tables 1 and 2 are as follows.

(Thermoplastic Resin)

Acrylic rubber K-1: Acrylic rubber synthesized as described above (weight average molecular weight determined by GPC: 300000, glycidyl methacrylate 20% by mass, Tg −20° C.)

Acrylic rubber K-2: Acrylic rubber synthesized as described above (weight average molecular weight determined by GPC: 400000, glycidyl methacrylate 10% by mass, Tg −28° C.)

HTR-860P-3CSP: Acrylic rubber having weight average molecular weight determined by GPC: 800000, glycidyl methacrylate 3% by mass, Tg 12° C. (manufactured by Nagase ChemteX Corp., trade name)

(Thermosetting Component)

N500P-10: Cresol novolac type polyfunctional epoxy resin (manufactured by DIC Corp., trade name)

EXA-830CRP: Bisphenol F type epoxy resin (manufactured by DIC Corp., trade name)

MEH-7800M: Phenol novolac resin (manufactured by Meiwa Chemical Co., Ltd., trade name)

(Silicone Compound)

SH3773M: Polyether-modified silicone compound (manufactured by Dow Corning-Toray Co., Ltd., trade name)

TA31-209E: Silicone-modified alkyd resin (manufactured by Hitachi Chemical Co., Ltd., trade name)

(Curing Accelerator)

2PZ-CN: Imidazole-based curing accelerator (manufactured by Shikoku Chemicals Corp., trade name)

(Filler)

SC2050-HLG: Epoxysilane surface-treated silica filler (manufactured by Admatechs Co., Ltd., trade name)

For the produced support tapes for substrate conveyance of Examples and Comparative Examples, the shear viscosity, the elastic modulus after heating, the 5% weight reduction temperature after heating, and the 90° peel strength after heating were evaluated by the methods described below. The evaluation results are presented in Tables 3 and 4.

[Measurement of Shear Viscosity]

The shear viscosity was measured by the following procedure. First, four sheets of a temporary fixing material layer having a thickness of 60 μm were laminated at 80° C. to produce a sample for measurement having a thickness of 240 μm. This sample for measurement was heated from 35° C. to 200° C. at a rate of temperature increase of 20° C./min while applying 5% strain using a rotary viscoelasticity analyzer (manufactured by TA Instruments, Inc., ARES) set under the following conditions, and the viscosity at the time of reaching 60° C. was measured.

Measurement method: "parallel plate"
Measurement jig: Circular jig having a diameter of 8 mm
Measurement mode: "Dynamic temperature ramp"
Frequency: 1 Hz

[Measurement of Elastic Modulus after Heating]

The elastic modulus was measured by the following procedure. First, four sheets of a temporary fixing material layer having a thickness of 60 μm were laminated at 80° C. to produce a film having a thickness of 240 μm. This was heated for 30 minutes in an oven at 130° C. and for 1 hour at 170° C. and then was cut out into a size of 4 mm in the thickness direction and 33 mm in width and length. The cut film was mounted on a dynamic viscoelasticity apparatus (product name: Rheogel-E4000, manufactured by UMB), a tensile load was applied thereto, the elastic modulus was measured at a frequency of 10 Hz and a rate of temperature increase of 3° C./min, and the measured value at 25° C. was recorded.

[5% Weight Reduction Temperature after Heating]

The 5% weight reduction temperature after heating was measured by the following procedure. First, four sheets of a temporary fixing material layer having a thickness of 60 μm were laminated at 80° C. to produce a film having a thickness of 240 μm. This was heated under predetermined conditions (for example, heated for 30 minutes in an oven at 130° C. and for 1 hour at 170° C.), and then 10 mg of the film was cut out as a measurement sample. This was measured using a differential thermal balance (manufactured by Seiko Instruments, Inc., TG/DTA220) at a rate of temperature increase of 10° C./min.

[Measurement of 90° Peel Strength after Heating (1)]

The 90° peel strength between a substrate and a temporary fixing material layer was evaluated by the following method. An organic substrate having a surface of solder resist AUS308 and having a thickness of 200 μm was placed on a stage of a roll laminator (manufactured by Taisei Laminator Co., Ltd., VA-400III), and a support tape for substrate conveyance, from which the protective film had been peeled, was laminated thereon at a temperature of 80° C., a pressure of 0.2 MPa, and a rate of 0.2 m/mins such that the temporary fixing material layer was stuck to the organic substrate side. The obtained sample was heated for 30 minutes at 130° C. and subsequently heated for 1 hour at 170° C., and then the sample was cut out into a size of 10 mm in width to obtain a film for measurement. The film for measurement was subjected to a peeling test at a rate of 300 mm/min using a peeling testing machine set up so as to have a peeling angle of 90°, and the peel strength at that time was designated as 90° peel strength.

[Measurement of 90° Peel Strength after Heating (2)]

The 90° peel strength between a substrate and a temporary fixing material layer was evaluated by the following method. An organic substrate having a surface of solder resist AUS308 and having a thickness of 200 μm was placed on a stage of a roll laminator (manufactured by Taisei Laminator Co., Ltd., VA-400III), and a support tape for substrate conveyance, from which the protective film had been peeled, was laminated thereon at a temperature of 80° C., a pressure of 0.2 MPa, and a rate of 0.2 m/mins such that the temporary fixing material layer was stuck to the organic substrate side. The obtained sample was heated for 30 minutes at 130° C. and subsequently heated for 1 hour at 170° C., this was further heated for 5 minutes at 260° C., and then the sample was cut out into a size of 10 mm in width to obtain a film for measurement. The film for measurement was subjected to a peeling test at a rate of 300 mm/min using a peeling testing machine set up so as to have a peeling angle of 90°, and the peel strength at that time was designated as 90° peel strength.

TABLE 3

| | Example 1 | Example 2 | Example 3 | Example 4 | Example 5 |
|---|---|---|---|---|---|
| Shear viscosity (Pa · s) | 6000 | 3820 | 4830 | 6030 | 5980 |
| Elastic modulus after heating (MPa) | 340 | 620 | 860 | 350 | 330 |
| 5% Weight reduction temperature after heating (° C.) | 330 | 340 | 350 | 320 | 320 |
| 90° Peel strength after heating (1) (N/m) | 130 | 250 | 140 | 50 | 70 |
| 90° Peel strength after heating (2) (N/m) | 160 | 280 | 170 | 60 | 90 |

TABLE 4

| | Comparative Example 1 | Comparative Example 2 |
|---|---|---|
| Shear viscosity (Pa · s) | 13200 | 12300 |
| Elastic modulus after heating (MPa) | 1400 | 1320 |
| 5% Weight reduction temperature after heating (° C.) | 340 | 365 |
| 90° Peel strength after heating (1) (N/m) | 10 | >300 Not peeled |
| 90° Peel strength after heating (2) (N/m) | 15 | >300 Not peeled |

According to the support tapes of Examples 1 to 5 having a shear viscosity of 100 to 10000 Pa·s at 60° C., the support tapes can be sufficiently stuck to organic substrates at low temperatures, and the handleability of thin organic substrates can be enhanced. Furthermore, since the support tapes of Examples 1 to 5 whose elastic modulus and the 5% weight reduction temperature after heating are in predetermined ranges, have sufficient heat resistance and can fix a support film to an organic substrate with appropriate peel strength, mounting and sealing of a semiconductor chip on an organic substrate can be satisfactorily carried out while sufficiently reinforcing the organic substrate. In addition, since the support tapes of Examples 1 to 5, which do not include a silicone-based release agent or have the content of a silicone-based release agent in a predetermined range or less, and which have the elastic modulus after heating in a predetermined range, can exhibit appropriate peel strength, the support tapes can be easily peeled while making contamination of the organic substrate sufficiently small.

REFERENCE SIGNS LIST

1, 1*a*, 1*b*: support film, 2A, 2B, 2C: temporary fixing material layer, 2*a*: first resin layer, 2*b*: second resin layer, 3: protective film, 10, 20: support tape, 15: laminated body, 30: thin substrate, 35: laminated body, 40: semiconductor chip, 50: sealing material, 55: semiconductor chip-packaged substrate, 60: semiconductor element, 65: solder ball, 70: wiring board, 100: electronic device.

The invention claimed is:

1. A method for producing an electronic device, the method comprising:

forming a laminated body including a temporary fixing material located between a support and an organic substrate having a thickness of 1000 μm or less;

heating the temporary fixing material of the laminated body;

mounting a semiconductor chip on the organic substrate of the laminated body after heating the temporary fixing material;

sealing the semiconductor chip mounted on the organic substrate with a sealing material; and peeling the support and the temporary fixing material from the organic substrate of the laminated body after sealing the semiconductor chip, wherein the temporary fixing material comprises a thermoplastic resin, a thermosetting resin, a filler, and a curing accelerator, and either contains no silicone-based release agent or has a content of a silicone-based release agent of 10% by mass or less based on a total amount of the temporary fixing material, the filler is an inorganic and/or organic filler, and a content of the filler in the temporary fixing material is 5-300 parts by mass with respect to 100 parts by mass of the thermoplastic resin, the thermoplastic resin consists of a (meth)acrylic copolymer having a crosslinkable epoxy group, a Tg of −50° C. to 50° C., and a weight average molecular weight of 100000 to 400000, the thermosetting resin consists of an epoxy resin, the temporary fixing material further comprises an epoxy resin curing agent that cures the epoxy resin, the epoxy resin curing agent consisting of a phenol resin, the combined content of the thermoplastic resin, the thermosetting resin, the filler, the curing accelerator, and the epoxy resin curing agent is 90% by mass or more based on the total amount of the temporary fixing material, the content of the thermosetting resin in the temporary fixing material is 10 to 60 parts by mass with respect to 100 parts by mass of the thermoplastic resin, the curing accelerator consists of an imidazole, the content of the curing accelerator in the temporary fixing material is 0.01 to 5.0 parts by mass with respect to a total of 100 parts by mass of the thermoplastic resin and the thermosetting resin, and wherein the temporary fixing material has a shear viscosity of 100 to 10000 Pa·s at 60° C., an elastic modulus of 10 to 1000 MPa at 25° C. after being heated for 30 minutes at 130° C. and for 1 hour at 170° C., and a 5% weight reduction temperature of 300° C. or higher after being heated for 30 minutes at 130° C. and for 1 hour at 170° C.

2. The method according to claim 1, wherein the organic substrate is a coreless substrate.

3. The method according to claim 1, wherein the support is a polyethylene terephthalate film, a polybutylene terephthalate film, a polyethylene naphthalate film, a polypropylene film, a polyamide film, or a polyimide film.

4. The method according to claim 1, wherein the support is attached to the organic substrate in a tape form when the laminated body is formed.

5. The method according to claim 1, wherein the laminated body is formed using a support tape, the support tape comprising a support film as the support and a temporary fixing material layer provided on the support film and formed from the temporary fixing material.

6. A resin composition for temporarily fixing a support for substrate conveyance to an organic substrate, the resin composition comprising a thermoplastic resin, a thermosetting resin, a filler, a curing accelerator, and either containing no silicone-based release agent or having a content of a silicone-based release agent of 10% by mass or less based on a total amount of the resin composition, wherein the filler is an inorganic and/or organic filler, and a content of the filler in the resin composition is 5-300 parts by mass with respect to 100 parts by mass of the thermoplastic resin, the thermoplastic resin consists of a (meth)acrylic copolymer having a crosslinkable epoxy group, a Tg of −50° C. to 50° C., and a weight average molecular weight of 100000 to 400000, the thermosetting resin consists of an epoxy resin, the resin composition for temporary fixing further comprises an epoxy resin curing agent that cures the epoxy resin, the epoxy resin curing agent consisting of a phenol resin, the combined content of the thermoplastic resin, the thermosetting resin, the filler, the curing accelerator, and the epoxy resin curing agent is 90% by mass or more based on the total amount of the resin composition, the content of the thermosetting resin in the resin composition is 10 to 60 parts by mass with respect to 100 parts by mass of the thermoplastic resin, the curing accelerator consists of an imidazole, the content of the curing accelerator in the resin composition is 0.01 to 5.0 parts by mass with respect to a total of 100 parts by mass of the thermoplastic resin and the thermosetting resin, and wherein when the resin composition is formed into a film shape, the film has a shear viscosity at 60° C. of 100 to 10000 Pa·s, an elastic modulus of 10 to 1000 MPa at 25° C. after being heated for 30 minutes at 130° C. and for 1 hour at 170° C., and a 5% weight reduction temperature of 300° C. or higher after being heated for 30 minutes at 130° C. and for 1 hour at 170° C.

7. A support tape for substrate conveyance, comprising:

a support film for conveying an organic substrate; and a temporary fixing material layer provided on the support film for temporarily fixing the organic substrate and the support film, wherein the temporary fixing material layer comprises a thermoplastic resin, a thermosetting resin, a filler, a curing accelerator, and either contains no silicone-based release agent or has a content of a silicone-based release agent of 10% by mass or less based on a total amount of the temporary fixing material layer, the filler is an inorganic and/or organic filler, and a content of the filler in the temporary fixing material layer is 5-300 parts by mass with respect to 100 parts by mass of the thermoplastic resin, the thermoplastic resin consists of a (meth)acrylic copolymer having a crosslinkable epoxy group, a Tg of −50° C. to 50° C., and a weight average molecular weight of 100000 to 400000, the thermosetting resin consists of an epoxy resin, the temporary fixing material layer further comprises an epoxy resin curing agent that cures the epoxy resin, the epoxy resin curing agent consisting of a phenol resin, the combined content of the thermoplastic resin, the thermosetting resin, the curing accelerator, the filler and the epoxy resin curing agent is 90% by mass or more based on the total amount of the temporary fixing material layer, the content of the thermosetting resin in the temporary fixing material layer is 10 to 60 parts by mass with respect to 100 parts by mass of the thermoplastic resin, the curing accelerator consists of an imidazole, the content of the curing accelerator in the temporary fixing material layer is 0.01 to 5.0 parts by mass with respect to a total of 100 parts by mass of the thermoplastic resin and the thermosetting resin, and wherein the temporary fixing material layer has a shear viscosity at 60° C. of 100 to 10000 Pa·s, an elastic modulus of 10 to 1000 MPa at 25° C. after being heated for 30 minutes at 130° C. and for 1 hour at 170° C., and a 5% weight reduction temperature of 300° C. or higher after being heated for 30 minutes at 130° C. and for 1 hour at 170° C.

8. The support tape according to claim 7, wherein the support film is a polyethylene terephthalate film, a polybutylene terephthalate film, a polyethylene naphthalate film, a polypropylene film, a polyamide film, or a polyimide film.

9. A method for producing an electronic device, the method comprising:

forming a laminated body including a temporary fixing material located between a support and an organic substrate having a thickness of 1000 μm or less;

heating the temporary fixing material of the laminated body;

mounting a semiconductor chip on the organic substrate of the laminated body after heating the temporary fixing material;

sealing the semiconductor chip mounted on the organic substrate with a sealing material; and peeling the support and the temporary fixing material from the organic substrate of the laminated body after sealing the semiconductor chip, wherein the temporary fixing material comprises a thermoplastic resin, a thermosetting resin, and a curing accelerator, and either contains no silicone-based release agent or has a content of a silicone-based release agent of 10% by mass or less based on a total amount of the temporary fixing material, the thermoplastic resin consists of a (meth)acrylic copolymer having a crosslinkable epoxy group, a Tg of −50° C. to 50° C., and a weight average molecular weight of 100000 to 400000, the thermosetting resin consists of an epoxy resin, the temporary fixing material further comprises an epoxy resin curing agent that cures the epoxy resin, the epoxy resin curing agent consisting of a phenol resin, the combined content of the thermoplastic resin, the thermosetting resin, the curing accelerator, and the epoxy resin curing agent is 90% by mass or more based on the total amount of the temporary fixing material, the content of the thermosetting resin in the temporary fixing material is 10 to 60 parts by mass with respect to 100 parts by mass of the thermoplastic resin, the curing accelerator consists of an imidazole, the content of the curing accelerator in the temporary fixing material is 0.01 to 5.0 parts by mass with respect to a total of 100 parts by mass of the thermoplastic resin and the thermosetting resin, and wherein the temporary fixing material has a shear viscosity of 100 to 10000 Pa·s at 60° C., an elastic modulus of 10 to 1000 MPa at 25° C. after being heated for 30 minutes at 130° C. and for 1 hour at 170° C., and a 5% weight reduction temperature of 300° C. or higher after being heated for 30 minutes at 130° C. and for 1 hour at 170° C.

10. The method according to claim 9, wherein the organic substrate is a coreless substrate.

11. The method according to claim 9, wherein the support is a polyethylene terephthalate film, a polybutylene terephthalate film, a polyethylene naphthalate film, a polypropylene film, a polyamide film, or a polyimide film.

12. The method according to claim 9, wherein the support is attached to the organic substrate in a tape form when the laminated body is formed.

13. The method according to claim 9, wherein the laminated body is formed using a support tape, the support tape comprising a support film as the support and a temporary fixing material layer provided on the support film and formed from the temporary fixing material.

* * * * *